United States Patent
Iwakawa

(10) Patent No.: US 9,837,978 B2
(45) Date of Patent: Dec. 5, 2017

(54) PIEZOELECTRIC COMPONENT

(71) Applicant: KYOCERA Corporation, Kyoto-shi, Kyoto (JP)

(72) Inventor: Yoshiaki Iwakawa, Kirishima (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 310 days.

(21) Appl. No.: 14/651,041

(22) PCT Filed: Dec. 25, 2013

(86) PCT No.: PCT/JP2013/084699
§ 371 (c)(1),
(2) Date: Jun. 10, 2015

(87) PCT Pub. No.: WO2014/104110
PCT Pub. Date: Jul. 3, 2014

(65) Prior Publication Data
US 2015/0333728 A1 Nov. 19, 2015

(30) Foreign Application Priority Data
Dec. 27, 2012 (JP) ................. 2012-285333

(51) Int. Cl.
*H03H 9/02* (2006.01)
*H03H 9/05* (2006.01)
(Continued)

(52) U.S. Cl.
CPC ...... *H03H 9/0504* (2013.01); *H03H 9/02055* (2013.01); *H03H 9/02086* (2013.01);
(Continued)

(58) Field of Classification Search
CPC .......... H03H 9/02086; H03H 9/02055; H03H 9/0504; H03H 9/0509; H03H 9/1014; H03H 9/15; H03H 9/17; H03H 9/19
(Continued)

(56) References Cited

U.S. PATENT DOCUMENTS

| | | |
|---|---|---|
| 2005/0057324 A1 | 3/2005 | Onishi et al. |
| 2012/0056514 A1* | 3/2012 | Ishikawa ............ H03H 9/02157 310/344 |

FOREIGN PATENT DOCUMENTS

| | | |
|---|---|---|
| CN | 1595799 A | 3/2005 |
| JP | 05-136647 A | 6/1993 |

(Continued)

OTHER PUBLICATIONS

Chinese Office Action with English concise explanation, Chinese Patent Application No. 201380064037.4, dated Oct. 31, 2016, 8 pgs.
(Continued)

*Primary Examiner* — Derek Rosenau
(74) *Attorney, Agent, or Firm* — Volpe and Koenig, P.C.

(57) ABSTRACT

A piezoelectric component in which leakage of vibration is suppressed and vibration characteristics are excellent is provided. A piezoelectric component of the invention includes a support substrate; and a piezoelectric element mounted on the support substrate. The piezoelectric element includes electrodes (vibration electrodes) on one main surface and the other main surface of the piezoelectric element so that the electrodes have an area facing each other, and a concave area extending in a width direction of the piezoelectric element, in at least one of excepted areas which are areas other than the electrodes facing each other of the one main surface and the other main surface. At least part of corner portions of the concave area which extend in the width direction forms a curved surface.

5 Claims, 7 Drawing Sheets

(51) Int. Cl.
*H03H 9/17* (2006.01)
*H03H 9/10* (2006.01)

(52) U.S. Cl.
CPC ........... *H03H 9/17* (2013.01); *H03H 9/02118* (2013.01); *H03H 9/0509* (2013.01); *H03H 9/1014* (2013.01)

(58) Field of Classification Search
USPC .................................................. 310/344, 348
See application file for complete search history.

(56) References Cited

FOREIGN PATENT DOCUMENTS

| | | |
|---|---|---|
| JP | 06-052230 U | 7/1994 |
| JP | 06-291590 A | 10/1994 |
| JP | 07-154198 A | 6/1995 |
| JP | 11-261364 A | 9/1999 |
| JP | 2003-046366 A | 2/2003 |
| JP | 2005-210404 A | 8/2005 |

OTHER PUBLICATIONS

International Search Report, PCT/JP2013/084699, dated Feb. 25, 2014, 2 pgs.

\* cited by examiner

PIEZOELECTRIC COMPONENT

TECHNICAL FIELD

The present invention relates to a piezoelectric component capable of obtaining highly-reliable and highly accurate frequency characteristics.

BACKGROUND ART

A piezoelectric resonator using a piezoelectric element is frequently used as a small resonator for a clock pulse oscillator of a microcomputer and the like. For example, as shown in FIG. 7, a piezoelectric component (piezoelectric resonator) including a support substrate 61 and a piezoelectric element 63 both ends of which are fixed on the support substrate 61 by a conductive joining material 62 is known, in which a capacitance is formed by an electrode 64 provided on an upper surface of the support substrate 61 and an electrode 65 provided on a lower surface of the support substrate 61 to be a capacitor device (refer to Patent Literature 1).

Here, the piezoelectric element has a structure in which vibration electrodes are formed so as to extend in different longitudinal directions respectively on both main surfaces of the substrate composed of a piezoelectric porcelain in a strip shape.

CITATION LIST

Patent Literature

Patent Literature 1: Japanese Unexamined Patent Publication JP-A 2005-210404

SUMMARY OF INVENTION

Technical Problem

The above piezoelectric component in which the piezoelectric element is mounted on the support substrate is required to be further reduced in size. However, the vibration formed and confined by opposed vibration electrodes in the piezoelectric element may leak toward the outside through the conductive joining material 62 on both ends of the piezoelectric element which becomes close to each other due to size reduction, which may reduce vibration energy and may deteriorate vibration characteristics.

The invention has been made in view of the above problems, and an object thereof is to provide a piezoelectric component in which leakage of vibration is suppressed and vibration characteristics are excellent.

Solution to Problem

The invention provides a piezoelectric component including a support substrate and a piezoelectric element mounted on the support substrate, in which the piezoelectric element includes electrodes disposed on one main surface and the other main surface of the piezoelectric element so that the electrodes have an area facing each other, and a concave area extending in a width direction of the piezoelectric element, in at least one of excepted areas which are areas other than the electrodes facing each other of the one main surface and the other main surface, and at least part of corner portions of the concave area which extend in the width direction and are placed closer to the electrodes forms a curved surface.

Advantageous Effects of Invention

According to the invention, since the propagation of vibration waves are suppressed in the concave area which is thin in thickness, the leakage of vibration to both ends of the piezoelectric element is suppressed. Furthermore, at least part of corner portions of the concave area extend in the width direction and are placed closer to the electrode forms the curved surface, thereby suppressing the generation of ripples due to the reflection of vibration. Therefore, the piezoelectric component with excellent vibration characteristics can be realized.

DESCRIPTION OF EMBODIMENTS

A piezoelectric component according to an embodiment of the invention will be explained in detail with reference to the drawings.

Figure 1:
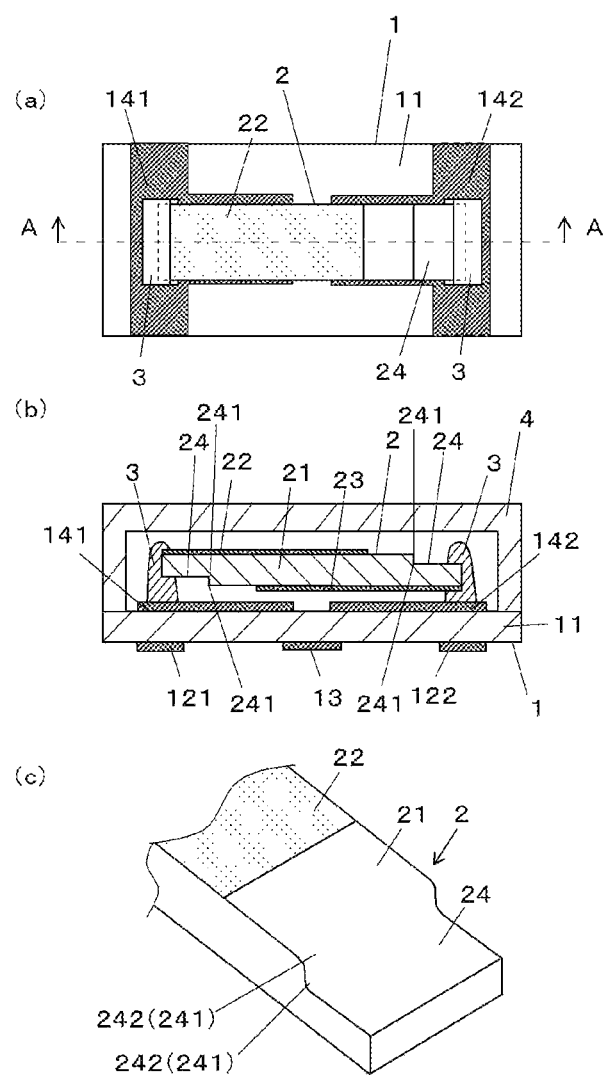
FIG. 1 (*a*) is a partially-omitted schematic plan view showing a piezoelectric component according to an embodiment of the invention, FIG. 1(*b*) is a schematic cross-sectional view taken along the line A-A shown in FIG. 1(*a*), and FIG. 1(*c*) is an enlarged perspective view of a main part of the piezoelectric component shown in FIG. 1(*a*)

FIG. 1(*a*) is a partially-omitted (a lid body is omitted) schematic plan view of a piezoelectric component according to an embodiment of the invention, FIG. 1(*b*) is a schematic cross-sectional view taken along the line A-A shown in FIG. 1(*a*), and FIG. 1(*c*) is an enlarged perspective view of a main part of the piezoelectric component shown in FIG. 1(*a*).

The piezoelectric component in an example shown in FIG. 1 includes a support substrate 1 and a piezoelectric element 2 mounted on the support substrate 1, in which the piezoelectric element 2 has electrodes (vibration electrodes 22 and 23) on one main surface and the other main surface of the piezoelectric element so that the electrodes have an area facing each other, and a concave area 24 extending in a width direction of the piezoelectric element, in at least one of excepted areas which are areas other than the area where the electrodes (vibration electrodes 22 and 23) face each other of the one main surface and the other main surface, and at least part of corner portions of the concave area 24 which extend in the width direction and are placed closer to the electrodes (vibration electrodes 22 and 23) forms a curved surface.

The support substrate 1 includes a support substrate body 11 formed as a rectangular flat plate having a length of 2.5 mm to 7.5 mm, a width of 1.0 mm to 3.0 mm and a thickness of 0.1 mm to 1 mm. The support substrate body 11 can use ceramic materials such as alumina or barium titanate, or resin materials such as glass epoxy.

A pair of signal terminals 121 and 122 and a ground terminal 13 are provided on an lower surface of the support substrate body 11 constituting the support substrate 1, and wiring conductors 141 and 142 are provided so as to be electrically connected to the pair of signal terminals 121 and 122 from an upper surface to side surfaces of the support substrate body 11. These terminals and conductors are formed by printing and sintering a conductive paste containing metal powder of, for example, gold, silver, copper, aluminum, tungsten or the like. It is also preferable to perform plating of Ni/Au, Ni/Sn or the like according to need.

The piezoelectric element 2 includes a piezoelectric body 21 and the electrodes (vibration electrodes 22 and 23) provided on both main substrates of the piezoelectric body 21.

The piezoelectric element 2 is mounted on the support substrate 1. Specifically, both end portions of the piezoelectric element 2 are fixed on the support substrate 1 by a conductive joining material 3 so that vibration excited between the vibration electrodes (22, 23) can be realized.

The piezoelectric body 21 constituting the piezoelectric element 2 is formed as a rectangular flat plate having, for example, a length of 1.0 mm to 5.0 mm, a width of 0.2 mm to 2 mm and a thickness of 40 µm to 1 mm. The piezoelectric substrate 21 can be formed by performing polarization treatment to a piezoelectric ceramics based on, for example, lead titanate, lead zirconate titanate, sodium niobate, potassium niobate, a bismuth layered compound or the like in a longitudinal direction or a thickness direction, or by selecting a suitable crystal orientation at the case of using a piezoelectric single crystal such as crystal, lithium tantalate or lithium niobate.

Further, the piezoelectric element 2 includes the electrodes (vibration electrodes 22 and 23) disposed on one main surface and the other main surface of the piezoelectric body 21 so that the electrodes have an area facing each other. The vibration electrode 22 provided on the upper main surface of the piezoelectric body 21 is provided so as to extend from one end portion toward the other end portion side in the longitudinal direction, and the vibration electrode 23 provided on the lower main surface of the piezoelectric body 21 is provided so as to extend from the other end portion toward one end portion side in the longitudinal direction, respectively having an area facing each other. The vibration electrodes 22 and 23 can use metal such as gold, silver, copper or aluminum, which are adhered on the surfaces of the piezoelectric body 21 respectively to have a thickness of, for example, 0.1 µm to 3 µm. Then, the vibration electrode 22 of the piezoelectric element 2 is electrically connected to the wiring conductor 141 through the conductive joining material 3 and the vibration electrode 3 of the piezoelectric element 2 is electrically connected to the wiring conductor 142 through the conductive joining material 3.

The conductive joining material 3 also has a function of securing a given space (gap) between an upper surface of the substrate 1 and a lower surface of the piezoelectric element 2. As such a conductive joining material 3, for example, solder, a conductive adhesive or the like can be used. In the case of using the solder, for example, materials formed of copper, tin or silver, which do not containing lead can be used. In the case of using the conductive adhesive, epoxy-based conductive resin or silicone-based resin containing 75 to 95 mass % of conductive particles such as silver, copper or nickel can be used.

The piezoelectric element 2 is configured to generate piezoelectric vibration of thickness longitudinal vibration or thickness shear vibration at a particular frequency in the area where the vibration electrode 22 faces the vibration electrode 23 when a voltage is applied between the vibration electrode 22 and the vibration electrode 23 from both end portions. Further, the confinement of vibration occurs due to the weight of the opposed electrodes.

Incidentally, a lid body 4 is provided so as to cover the piezoelectric element 2 above the support substrate 1. The lid body 4 is bonded to a peripheral portion on the upper surface of the support substrate 1 by an adhesive or the like, and therefore, the lid body 4 has a function of protecting the piezoelectric element 2 housed in a space formed with the support substrate 1 from physical effects and chemical effects from the outside and a hermetic sealing function for preventing foreign matters such as water from infiltrating into the space formed with the support substrate 1. As materials for the lid body 4, for example, metals such as SUS, ceramics such as alumina, resin, glass and so on can be used. It is also possible to use a material formed by allowing an insulating resin material such as an epoxy resin to contain an inorganic filler at a rate of 25 to 80 mass % to thereby reduce the difference in a thermal expansion coefficient with respect to the support substrate 1.

Moreover, the concave area 24 extending in the width direction is provided on at least one of excepted areas which are areas other than the areas where the electrodes (the vibration electrode 22 or the vibration electrode 23) face each other of one main surface and the other main surface. In the drawing, the concave area 24 is provided to keep a distance from the electrode (the vibration electrode 22 or the vibration electrode 23) disposed on the main surface on which the concave area 24 is disposed.

As shapes of the concave area 24, for example as shown in FIG. 1, a concave shape extending to an end face to keep a distance from the electrode (the vibration electrode 22 or the vibration electrode 23), in other words, a shape in which a step is formed to keep a distance from the electrode (the vibration electrode 22 or the vibration electrode 23) can be cited. A depth of the concave area 24 is preferably a depth, for example, of 0.01 mm or more and 50% or less of the thickness of the piezoelectric body 21 from the view point of realizing later-described effects while maintaining the strength of the piezoelectric element 2.

Additionally, the language "extend in the width direction" means that the concave area 24 is formed so as to extend to at least half or more of the distance of the piezoelectric element (piezoelectric body 21) in the width direction, and is preferably formed so as to extend over the entire area in the width direction.

The confinement of vibration energy is effectively realized and propagation of vibration waves to the outside (end face side) of the concave area 24 is suppressed by the existence of the concave area 24. Therefore, even when a distance with the end portion in an area where the vibration electrodes 22 and 23 are not provided is reduced due to the further size reduction and vibration tends to be transmitted to the end portion, the leakage of vibration to the end portion of the electronic device 2 is suppressed. Accordingly, it is possible to realize the piezoelectric component having excellent vibration characteristics which is capable of suppressing the lowering of the vibration energy and further reducing the size.

Furthermore, at least part of corner portions 241 of the concave area 24 which extend in the width direction and are placed closer to at least the electrode (vibration electrode 22, 23) forms a curved surface 242 (R surface).

Here, the language "at least part" means an area of at least one third or more of the distance in the width direction (width direction of the piezoelectric element 2) of the corner portions 241, and, in particular, the area is preferably an area of half or more of the distance in the width direction of the corner portions 241. The language "corner portions 241 placed closer to the electrode (vibration electrodes 22, 23)" means both the corner portion 241 on an opening side and the corner portion 241 on a bottom surface side which are placed closer to the electrode (vibration electrodes 22, 23) in the concave area 24, and the curved surface 242 is preferably provided in the corner portion 241 on the opening side because it is effective to form the curved surface 242 on the opening side where vibration can easily occur.

A curvature radius of the curved surface of the corner portion 241 on the opening side seen in a vertical cross section (cross section along the longitudinal direction of the piezoelectric element 2) is set to, for example, 0.005 to 0.05 mm, and a curvature radius of the curved surface of the corner portion 241 on the bottom surface side seen in the vertical cross section (cross section along the longitudinal direction of the piezoelectric element 2) is set to, for example, 0.005 to 0.5 mm.

Though reflected waves are generated toward the inside (electrode side) in the concave area 24, since at least part of the corner portions 241 of the concave areas which extend in the width direction and are placed closer to at least the electrode (vibration electrode 22, 23) forms the curved surface 242, the angle of a reflection surface varies in the thickness direction to thereby disperse and damp the reflected waves. As a result, generation of ripples due to the reflection of vibration by the corner portions 241 can be suppressed. It is thus possible to suppress the deterioration of vibration characteristics (deterioration of resonance characteristics) due to the generation of ripples.

The above effects can be obtained when a thin portion in the concave area 24 exists between the area where the electrodes (the vibration electrode 22 or the vibration electrode 23) face each other and the conductive joining material 3.

Here, the effects can be obtained even when the concave area 24 is provided only on one main surface. However, since the propagation of vibration waves to the outside (end face side) of the concave areas 24 is suppressed on both main surfaces by providing the concave areas 24 on both main surfaces which are one main surface and the other main surface of the piezoelectric element 2 (piezoelectric body 21), the leakage of vibration to both end portions of the piezoelectric element 2 is suppressed. Additionally, since at least parts of the corner portions 241 of concave areas 24 which extend in the width direction and are placed closer to the electrode (the vibration electrode 22 or the vibration electrode 23), form curved surfaces, it is possible to suppress the generation of ripples due to the reflection of vibration on both main surfaces. Therefore, the piezoelectric component having further excellent vibration characteristics can be realized.

Figure 2:
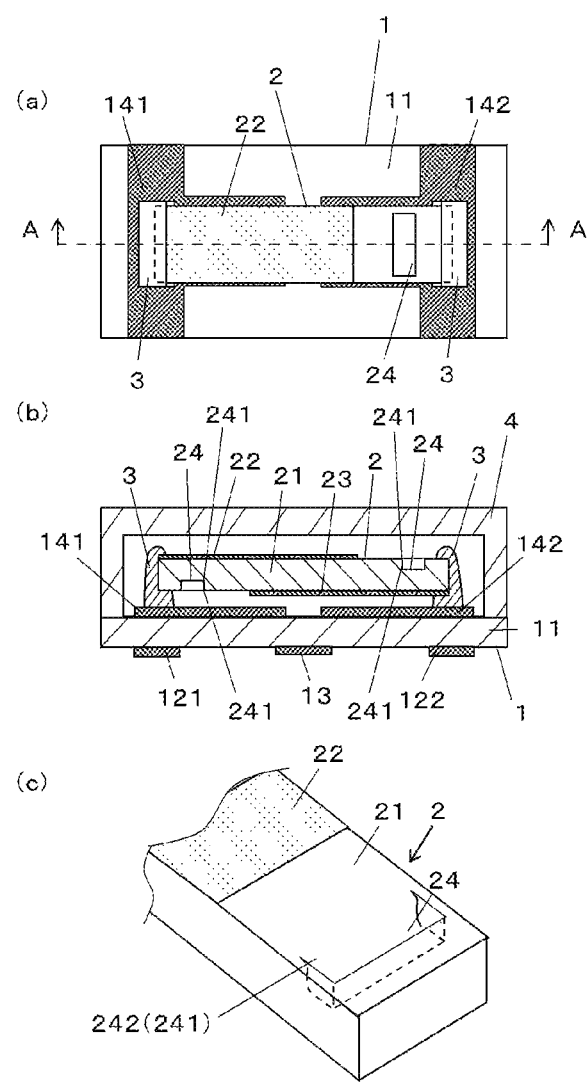
FIG. 2 (*a*) is a partially-omitted schematic plan view showing a piezoelectric component according to another embodiment of the invention, FIG. 2(*b*) is a schematic cross-sectional view taken along the line A-A shown in FIG. 2(*a*), and FIG. 2(*c*) is an enlarged perspective view of a main part of the piezoelectric component shown in FIG. 2(*a*)

In addition, the concave areas 24 are preferably groove-shaped as shown in FIG. 2. According to the structure, the thickness at both end portions of the piezoelectric element 2 can be secured and the strength (bonding strength) of holding the piezoelectric element 2 can be maintained as in the past.

Figure 3:
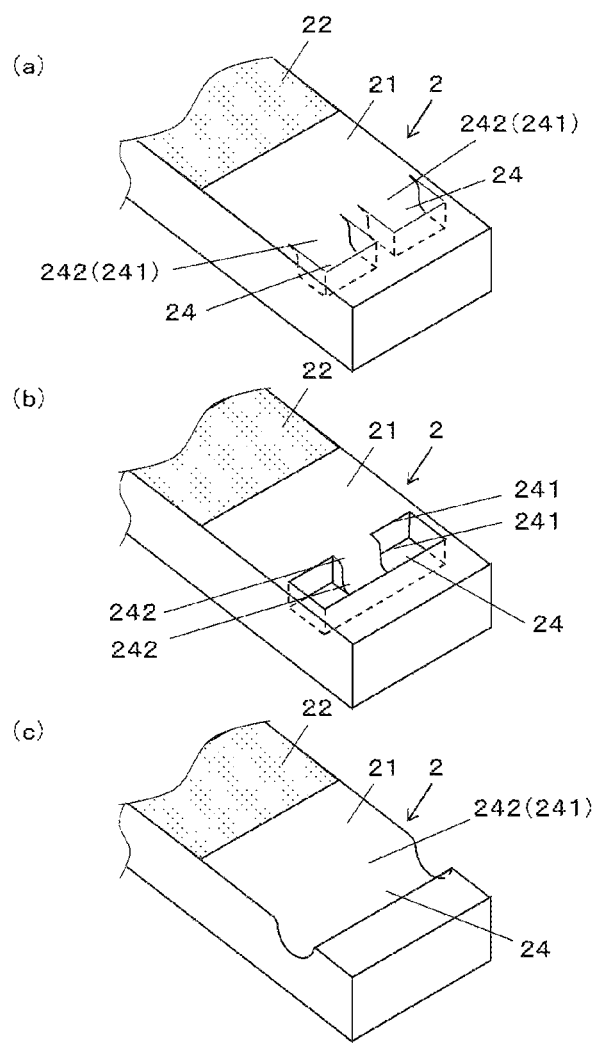
FIGS. 3 (*a*) to 3(*c*) are enlarged perspective views of a main part of a piezoelectric component according to another embodiment of the invention.

As shown in FIG. 3(a), two concave areas 24 extending in the width direction are provided, and the corner portions 241 of respective concave areas 24 placed closer to the electrode (the vibration electrode 22 or the vibration electrode 23) may form a curved surface. As shown in FIG. 3(b), a part of the corner portions 241 of the concave area 24 which extend in the width direction and are placed closer to the electrode (the vibration electrode 22 or the vibration electrode 23) may form the curved surface.

Further, as shown in FIG. 3(c), the groove-shaped concave area 24 may extend over the entire area in the width direction of the piezoelectric element 2, and the entire area of the corner portion 241 of the concave area 24 placed closer to the electrode (the vibration electrode 22 or the vibration electrode 23) may form the curved surface. Since the curved surface 242 extends over the entire area of the corner portion 241, the reflection of vibration can be further suppressed and the generation of ripples can be further suppressed.

Figure 4:
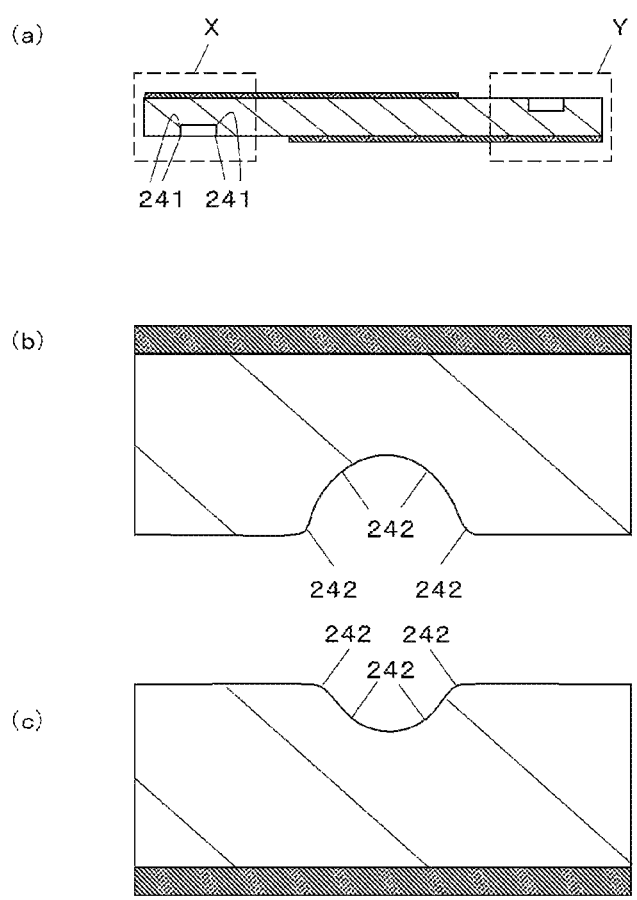
FIG. 4 (*a*) is a partial enlarged cross-sectional view showing a piezoelectric component according to another embodiment of the invention, FIG. 4(*b*) is an enlarged view of an area X shown in FIG. 4(*a*), and FIG. 4(*c*) is an enlarged view of an area Y shown in FIG. 4(*a*)

Furthermore, as shown in FIG. 4, in the case where the concave areas 24 are provided on both one main surface and the other main surface of the piezoelectric element 2 (piezoelectric body 21), at least part of respective both main surfaces of at least the corner portion 241 on the electrode side of the concave area 24 provided on one main surface which corner portion 241 extends in the width direction and at least the corner portion 241 on the electrode side of the concave area 24 provided on the other main surface which corner portion 241 extends in the width direction preferably forms the curved surface. In the drawings, all corner portions 241 on the electrode side and the opposite side form curved surfaces 242 as described later. Since the corner portions 241, which extend in the width direction, of the concave areas 24 provided on both one main surface and the other main surface respectively form the curved surfaces 242, it is possible to suppress the reflection of vibration on both main surfaces and to suppress the generation of ripples.

Moreover, as shown in FIG. 4, when the curved surface of the concave area 24 provided on one main surface and the curved surface of the concave area 24 provided on the other main surface are seen in a vertical cross section (cross section taken along the longitudinal direction of the piezoelectric element 2) perpendicular to one main surface and the other main surface, curvature radii of respective curved lines defined by the curved surfaces and the vertical cross section are preferably different from each other. Accordingly, it is possible to change frequencies of ripples which may be generated by the reflection between respective curved surfaces to be dispersed, which can reduce the size of ripples. It is effective to set the difference of respective curvature radii is 0.01 mm or more.

Figure 5:
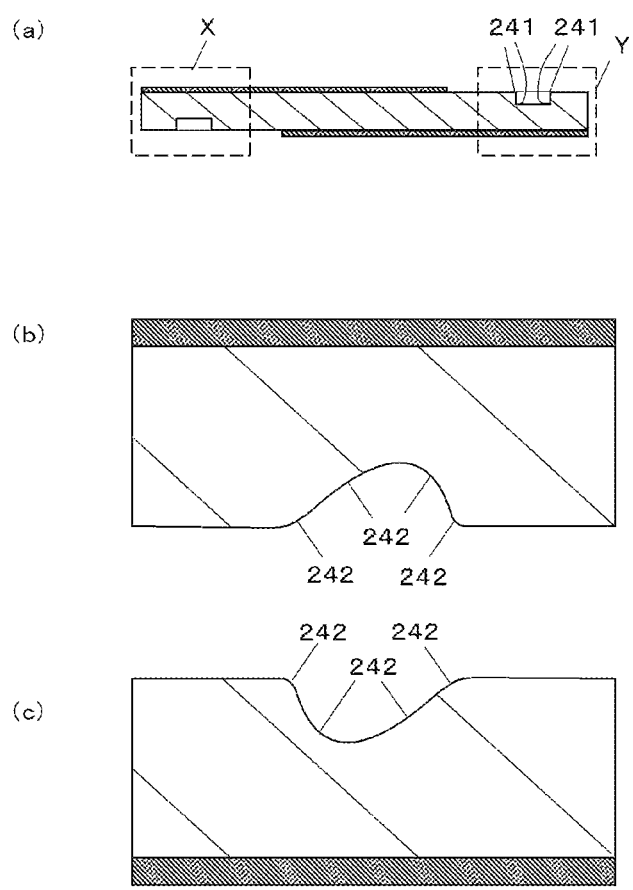
FIG. 5 (*a*) is a partial enlarged cross-sectional view showing a piezoelectric component according to further another embodiment of the invention, FIG. 5(*b*) is an enlarged view of an area X shown in FIG. 5(*a*), and FIG. 5(*c*) is an enlarged view of an area Y shown in FIG. 5(*a*)

Furthermore, as shown in FIG. 4 and FIG. 5, it is preferable that curved surfaces are respectively provided in the corner portion of the concave area 24 placed closer to the electrode (vibration electrode 22, 23) disposed on the main surface on which the concave area 24 is disposed and the corner portion placed farther from the electrode, thereby further suppressing the reflection of vibration and suppressing the generation of ripples effectively.

Then, as shown in FIG. 5, when the curved surface 242 of the concave area 24 placed closer to the electrode (vibration electrode 22, 23) disposed on the main surface on which the concave area 24 is disposed and the corner portion placed farther from the electrode are seen in a vertical cross section (cross section taken along the longitudinal direction of the piezoelectric element 2) perpendicular to one main surface and the other main surface, curvature radii of respective curved lines defined by the curved surfaces and the vertical cross section are preferably different from each other. Accordingly, it is possible to change frequencies of ripples which may be generated by the reflection between respective curved surfaces to be dispersed, which can reduce the size of ripples. It is effective to set the difference of respective curvature radii is 0.01 mm or more. Further, the curved surface having a larger curvature radius may be the curved surface 242 placed closer the electrode or the curved surface placed farther from the electrode.

The examples shown in FIG. 1 to FIG. 5 have the structure in which the concave area 24 is provided to keep a distance from the electrode (the vibration electrode 22 or the vibration electrode 23) provided on the main surface on which the concave area 24 is disposed. However, the invention is not limited to these examples, and it is sufficient that the concave area 24 is provided in an area other than the area where the electrodes (the vibration electrode 22 or the vibration electrode 23) face each other.

Figure 6:
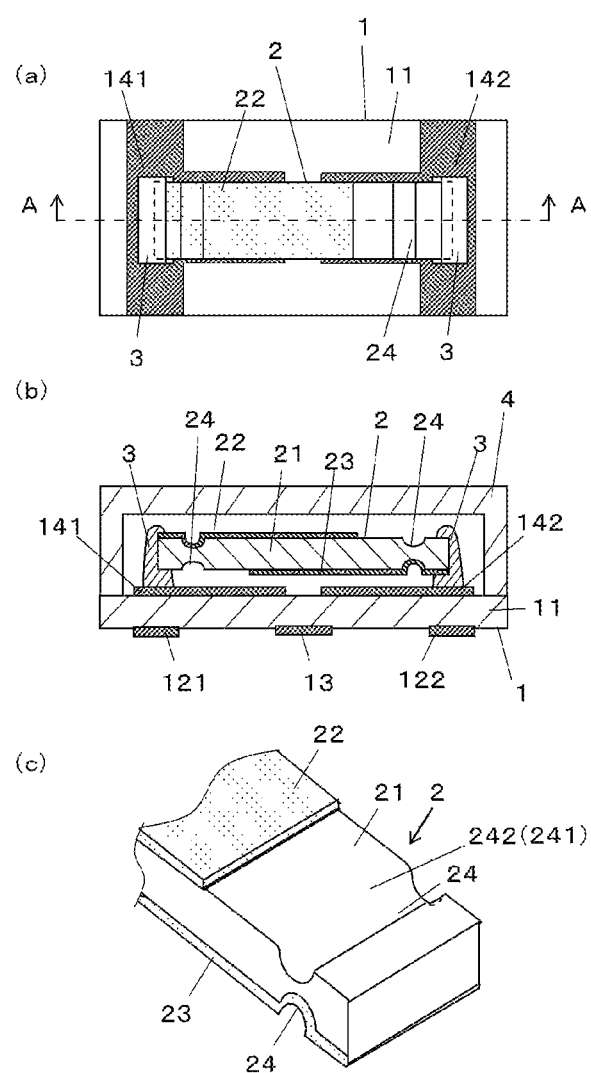
FIG. 6 (*a*) is a partially-omitted schematic plan view showing a piezoelectric component according to another embodiment of the invention, FIG. 6(*b*) is a schematic cross-sectional view taken along the line A-A shown in FIG. 6(*a*), and FIG. 6(*c*) is an enlarged perspective view of a main part of the piezoelectric component shown in FIG. 6(*a*)
Figure 7:
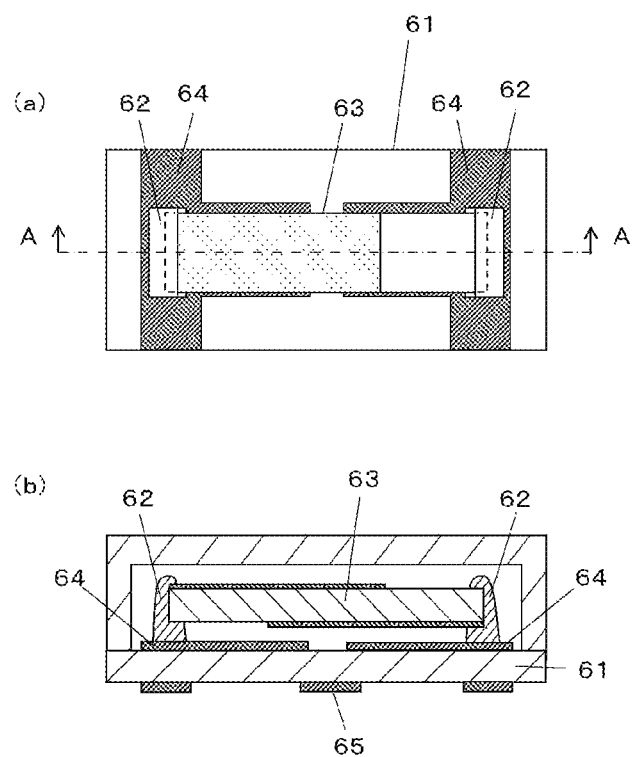
FIG. 7 (*a*) is a partially-omitted schematic plan view showing a piezoelectric component according to an embodiment of a related art and FIG. 7(*b*) is a schematic cross-sectional view taken along the line A-A shown in FIG. 7(*a*).

Specifically, as shown in FIG. 6, the concave area 24 may be provided in an area where the electrode (the vibration electrode 22 or the vibration electrode 23) is provided, which is an area other than the area where the electrodes (the vibration electrode 22 or the vibration electrode 23) face each other. Particularly, when the concave areas 24 are provided on both end portion sides of respective main surfaces (one end portion side where the electrode is provided and the other end portion where the electrode is not provided) as shown in FIG. 6, the effect of suppressing the leakage of vibration is increased.

Furthermore, in FIG. 6, the concave areas 24 are provided at positions overlapping in a plan view (the same position with respect to the longitudinal direction) on the respective main surfaces. However, the concave areas 24 may be provided by being shifted for maintaining the strength of the piezoelectric element 2.

However, as in the examples shown in FIG. 1 to FIG. 5, the structure in which the concave areas 24 are provided to keep a distance from the electrode (the vibration electrode 22 or the vibration electrode 23) disposed on the main surface on which the concave area 24 is disposed has advantages that the concave areas 24 can be formed after forming the electrodes and that it is not necessary to consider unevenness in thickness of electrodes at inner surfaces and corner portions of the concave areas 24.

Next, a manufacturing method of the piezoelectric component 1 according to the embodiment will be explained.

First, a segmentable substrate for fabricating the support substrate 1 is fabricated. For example, raw material power is mixed with water and a dispersant by using a ball mill, and then, a binder, a solvent, a plasticizer and so on are added to the mixture to form a green sheet. The green sheet is fired at a peak temperature of, for example, 900° C. to 1600° C. A conductive paste containing metal powder such as gold, silver, copper, aluminum or tungsten is printed and baked on this substrate.

Next, as to the piezoelectric body 21 constituting the piezoelectric element 2, raw material powder is mixed with water and a dispersant by using the ball mill, and then, a binder, a plasticizer and so on are added to the mixture, and the resultant is dried and granulated. The raw material thus obtained is press-molded and fired to obtain the piezoelectric porcelain. Here, the concave areas 24 and the R surfaces 242 of the piezoelectric element 2 can be formed by using a laser process or a sandblasting process, or by providing holes in a layer disposed on the surface side as a multilayer structure.

Electrodes are formed on end surfaces of the obtained piezoelectric porcelain, and the polarization treatment is performed by applying a voltage of, for example, 0.4 kV/mm to 6 kV/mm in the thickness direction at a temperature of 25° C. to 300° C.

The vibration electrode 22 and the vibration electrode 23 formed on upper and lower surfaces of the piezoelectric body 21 can be formed by depositing metal films on the upper and lower surfaces of the piezoelectric body 21 by using a vacuum deposition method, a PVD method, a sputtering method or otherwise with respect to the obtained piezoelectric porcelain, forming photoresist films having a thickness of approximately 1 μm to 10 μm on the respective metal films by using screen printing or otherwise and by patterning the films by photo-etching. The patterned piezoelectric porcelain is cut into a given size by dicing or otherwise to thereby fabricate the piezoelectric element 2.

Then, the piezoelectric elements 2 are mounted and fixed on the segmentable substrate by using the conductive joining material 3. When the conductive joining material 3 is a conductive adhesive formed by dispersing the metal powder in the resin, the conductive adhesive is applied on the wiring conductors 141 and 142 by using a dispenser or the like, and then, the piezoelectric element 2 is placed thereon and the resin of the conductive adhesive is cured by heating or irradiating ultraviolet rays.

Then, an opening peripheral surface of the lid body 4 is bonded to the peripheral portion on the upper surface of the support substrate 1 so as to cover the piezoelectric element 2. Concerning the lid body 4, a segmentable assembly lid-body sheet having plural concave portions is placed on the segmentable substrate by using the segmentable assembly lid-body sheet so that the concave portions cover the piezoelectric element 2, and convex portions of the assembly lid-body sheet to be the opening peripheral surface of the lid body 4 are bonded to the peripheral portion of the upper surface of the support substrate 1. For example, a thermosetting insulting adhesive is applied to the convex portions of the prepared assembly lid-body sheet to be the opening peripheral surface of the lid body 4, and the lid body 4 is placed on the upper surface of the support substrate 1. After that, the lid body 4 or the support substrate 1 is heated to thereby increase the temperature of the insulating adhesive to 100 to 150° C. to cure the adhesive, and the lid body 4 is bonded to the upper surface of the support substrate 1.

Lastly, respective piezoelectric components (individual pieces) are cut along boundary lines thereof by dicing or otherwise.

The piezoelectric component according to the invention is fabricated by the above method.

According to the above method, it is possible to obtain the piezoelectric component with less deterioration of characteristics by suppressing the leakage of vibration energy and the reflection of vibration, and it is possible to manufacture the high-performance piezoelectric component with good productivity despite of further reduction in size.

REFERENCE SIGNS LIST

1: Support substrate
11: Support substrate body
121, 122: Signal terminal
13: Ground terminal
141, 142: Wiring conductor
2: Piezoelectric element
21: Piezoelectric body
22, 23: Vibration electrode
3: Conductive joining material
4: Lid body

The invention claimed is:

1. A piezoelectric component, comprising:
a support substrate; and
a piezoelectric element mounted on the support substrate, the piezoelectric element including electrodes disposed on one main surface and the other main surface of the piezoelectric element so that the electrodes have an area facing each other, and a concave area provided to keep a distance from the electrodes, and extending in a width direction of the piezoelectric element, in both of excepted areas which are areas other than the electrodes facing each other of the one main surface and the other main surface, wherein
at least parts of corner portions of the concave areas which extend in the width direction and are placed closer to the electrodes forms a curved surface, and
when the curved surface in the corner portion of the concave area provided on the one main surface and the curved surface in the corner portion of the concave area provided on the other main surface are seen in a vertical cross section perpendicular to the one main surface and the other main surface, curvature radii of respective curved lines defined by the curved surfaces and the vertical cross section are different from each other.

2. The piezoelectric component according to claim 1, wherein an entire area of the corner portion extending in the width direction is the curved surface.

3. The piezoelectric component according to claim 1, wherein the concave area is groove-shaped.

4. A piezoelectric component comprising:
a support substrate; and
a piezoelectric element mounted on the support substrate, the piezoelectric element including electrodes disposed on one main surface and the other main surface of the piezoelectric element so that the electrodes have an area facing each other, and a concave area provided to keep a distance from the electrode disposed on a main surface on which the concave area is disposed, extending in a width direction of the piezoelectric element, in at least one of excepted areas which are areas other than the electrodes facing each other of the one main surface and the other main surface, and being groove-shaped,
wherein the curved surfaces are respectively provided in a corner portion of the concave area placed closer to the electrode disposed on a main surface on which the concave area is disposed and a corner portion of the concave area placed farther from the electrode, and
when the curved surface in the corner portion of the concave area placed closer to the electrode disposed on the main surface on which the concave area is disposed and the curved surface in the corner portion of the concave area placed farther from the electrode are seen in a vertical cross section perpendicular to the one main surface and the other main surface, curvature radii of respective curved lines defined by the curved surfaces and the vertical cross section are different from each other.

5. The piezoelectric component according to claim 4, wherein an entire area of the corner portion extending in the width direction is the curved surface.

* * * * *